United States Patent [19]
Hamamoto et al.

[11] Patent Number: 5,146,300
[45] Date of Patent: Sep. 8, 1992

[54] SEMICONDUCTOR INTEGRATED CIRCUIT DEVICE HAVING IMPROVED STACKED CAPACITOR AND MANUFACTURING METHOD THEREFOR

[75] Inventors: Takeshi Hamamoto; Toshifumi Kobayashi; Tadato Yamagata; Masaaki Mihara, all of Hyogo, Japan

[73] Assignee: Mitsubishi Denki Kabushiki Kaisha, Tokyo, Japan

[21] Appl. No.: 830,971

[22] Filed: Feb. 10, 1992

Related U.S. Application Data

[63] Continuation of Ser. No. 616,953, Nov. 21, 1990, abandoned.

[30] Foreign Application Priority Data

Nov. 27, 1989 [JP] Japan ................................. 1-308003

[51] Int. Cl.⁵ .................... H01L 29/68; H01L 21/70
[52] U.S. Cl. .................... 357/23.6; 357/41; 357/45; 357/51; 437/60; 437/919
[58] Field of Search ............ 357/23.6, 51, 41, 45; 437/60, 919

[56] References Cited

U.S. PATENT DOCUMENTS

| | | | |
|---|---|---|---|
| 3,701,980 | 10/1972 | Mundy . | |
| 4,894,693 | 1/1990 | Tigelaar et al. | 357/23.6 |
| 4,922,312 | 5/1990 | Coleman et al. | 357/23.6 |
| 4,958,318 | 9/1990 | Harari | 357/23.6 |

*Primary Examiner*—Edward J. Wojciechowicz
*Attorney, Agent, or Firm*—Lowe, Price, LeBlanc & Becker

[57] ABSTRACT

A semiconductor integrated circuit device including a semiconductor substrate having a main surface; a first conductive region formed on the main surface; a second conductive region formed on the main surface, spaced apart from the first conductive region and to be electrically connected to the first conductive region; and a capacitor having a storage node connecting the first and second conductive regions. The storage node serves to connect the first and second conductive regions and simultaneously stores charges. In other aspects of the invention, there are provided a memory cell having a structure described above, and a method of manufacturing the above-described semiconductor integrated circuit device.

11 Claims, 12 Drawing Sheets

SEMICONDUCTOR INTEGRATED CIRCUIT DEVICE HAVING IMPROVED STACKED CAPACITOR AND MANUFACTURING METHOD THEREFOR

This application is a continuation of application Ser. No. 616,953, filed Nov. 21, 1990, now abandoned.

BACKGROUND OF THE INVENTION

1. Field of the Invention

The present invention relates generally to semiconductor integrated circuit devices, and more particularly to a technology of a higher degree of integration of a semiconductor integrated circuit device having a stacked capacitor.

2. Description of the Related Art

In recent years, in order to apply the technique of microelectronics to industrial machinery and home appliances, a VLSI (Very-Large-Scale Integration) circuit which is a higher integrated LSI (Large Scale Integration) has been developed and are commercially available. In the case of a semiconductor memory device especially, the storage capacity has been increased thousand-fold in the last decade. The development of such high integration is realized by miniaturization of the size of a unit storage element, which constitutes a semiconductor memory device, by using a method called a proportional scaling.

As an example, a Dynamic Random Access Memory (DRAM) will be described in the following. A DRAM stores information as electric charges stored in a capacitor. As the stored charges leak and decrease, a refresh operation is required periodically in the DRAM. It is possible in the DRAM to access information at a definite access time regardless of the location of the information.

In the DRAM, a memory cell region is inevitably reduced with the miniaturization. The amount of charge which can be stored in the memory cell region with the same structure decreases with the reduction in the area of memory cells. With the advancement of the miniaturization, the amount of charge stored in the memory cells becomes extremely small, resulting in a marked degradation in reliability due to soft error or the like.

To cope with that problem, various improvements have been attempted for increasing a storage capacitance of the memory cells.

A three-transistor DRAM cell will be described in the following. After that, an application of a stacked capacitor to the three-transistor DRAM will be described.

Referring to FIG. 1, the DRAM includes: a memory cell array 1000 including a plurality of memory cells constituting a storage section; a row decoder 2000 and a column decoder 3000 connected respectively to a row address buffer 2100 and to a column address buffer 3100 for selecting the address of the DRAM; a control circuit 4000 for controlling the operation of the DRAM; and an input/output interface including sense amplifiers 1100 connected to an input/output circuit.

Referring to FIG. 2, a plurality of memory cells MC are disposed in a matrix form having a plurality of rows and columns. Each memory cell MC is connected to a corresponding reading selection line 120 and a writing selection line 110 connected to the row decoder 2000, and to a corresponding data-in line 108 and data-outline 121 connected to the column decoder 3000 through the sense amplifiers 1100, to constitute a memory cell array 1000.

In response to the externally applied row address signal and column address signal, a reading or writing selecting line 120, 110 and a data-in or data-out line 108, 121 are selected respectively with the row decoder 2000 and the column decoder 3000. A memory cell MC is selected with the selected lines. The externally applied data are stored in the selected memory cell MC. Or the data stored in the memory cell MC are read out of the same. The read/write instruction of the data is controlled by a read/write control signal given to the control circuit 4000.

Assuming that the memory cell array 1000 has n word lines and m bit lines, the memory cell array 1000 can store $N (=n \times m)$ bit data. The address of the memory cell, to which the data are to be written or from which the data are read out, is retained in the row address buffer 2100 and the column address buffer 3100.

M bits of the memory cells are connected to the sense amplifiers 1100 through data-in or data-out lines 108, 121 by the selection of a specific reading or writing selection line 120, 110 by the row decoder 2000 (selection of one word line out of n word lines). One sense amplifier out of the connected sense amplifiers 1100 is connected to the input/output circuit by the following selection of a specified data-in or data-out line 108, 121 by the column decoder 3000 (selection of one bit line out of m bit lines). Readout or writing is operated in the memory cell MC connected to the input/output circuit following the instruction from the control circuit 4000.

FIG. 3 is a circuit diagram of one example of a memory cell of the three-transistor DRAM. Referring to FIG. 3, the memory cell is connected to a writing selection line 110, a reading selection line 120, a data-in line 108 and a data-out line 121. The memory cell includes three N channel MOS transistors 11, 12 and 22.

The transistor 11 includes a transfer gate 4 connected to the writing selection line 110 and a source connected to the data-in line 108. The transistor 12 includes a storage gate 14 connected to a drain of the transistor 11, and a drain connected to ground 123. The transistor 22 includes a gate connected to the reading selection line 120, a drain connected to a source of the transistor 12, and a source connected to the data-out line 121.

An operation of the three-transistor DRAM will now be described with reference to FIG. 3. In data writing, a potential of "H" or "L", corresponding to data to be written into the cell, is supplied to the data-in line 108. The potential of "H" is supplied to the writing selection line 110. The potential of the transfer gate 4 of the transistor 11 attains "H", so that the transistor 11 is turned on. Charge corresponding to a potential on the data-in line 108 is stored in the storage gate 14 of the transistor 12.

With a potential on the writing selection line 110 attaining "L", the transistor 11 is turned off. Charge corresponding to write-in data remains in the storage gate 14, so that the writing is completed.

The data is held as the stored charge in a gate capacitance of the storage gate 14. Therefore, this RAM cell is of dynamic type, which requires a refresh operation.

In the DRAM cell in FIG. 3, data is stored as charge in the capacitance of the storage gate 14 of the transistor 12, as described above. Since the storage gate 14 is capacitively coupled to the drain or source of the transistor 12, the potential of the storage gate 14 is easily affected by a fluctuation in the potential on the drain or source. Data is liable to be destroyed due to soft error or the like because only a small amount of charge is stored on the gate capacitance. Also in data reading, a small potential difference results in a lower reliability in operation. In addition, the smaller capacitance also requires a frequent repetition of the refresh operation.

It is effective to add a capacitor to the memory cell for increasing the storage capacitance. FIG. 4 is an enlarged circuit diagram with a supplemental capacitance of a dashed-box A of FIG. 3. FIG. 5 is a section of the structure of a semiconductor integrated circuit device corresponding to FIG. 4. The common reference numerals in FIGS. 5 and 6 denote the same or corresponding portions.

Referring to FIGS. 5 and 6, the circuit A includes a N channel transistor 11 formed on the main surface of a P type semiconductor substrate 7, a capacitor 15 connected to a drain of the transistor 11, a transistor 12 formed in a region on the main surface of the substrate 7, which is isolated from the transistor 11 and the capacitor 15 by the isolation region 6, and an interconnection 16 made of polysilicon or metal for connecting the drain of the transistor 11 and the gate of the transistor 12.

The transistor 11 includes N+ impurity regions 5a, 5b spaced apart from each other on the main surface of the substrate 7, and a transfer gate 4 made of polysilicon, formed on the main surface of the substrate 7 between the impurity regions 5a and 5b. A gate oxide film is sandwiched between the gate 4 and the main surface of the substrate 7.

The capacitor 15 includes a storage node 1 made of polysilicon, connected to the impurity region 5b through the contact hole 18, a thin dielectric film 3 formed on the storage node 1, and a cell plate 2 made of storage node 1. The impurity region 5b is formed between the transfer gate 4 and the isolation region 6.

The transistor 12 includes N+ impurity regions 5c and 5d formed, spaced apart from each other, in a region on the main surface of the semiconductor substrate 7, which is isolated by the isolation region 6 from the region where the transistor 11 is formed, and a storage gate 14 formed on the main surface of the substrate 7 between the impurity regions 5c and 5d. A gate oxide film is sandwiched between the gate 14 and the main surface.

The interlayer insulation film 22 is formed on the memory cell, and the data-in line 108 made of polysilicon or metal is formed on the interlayer insulation film 22. The interconnection 16 is connected to the impurity region 5b through a contact hole 17a formed in the interlayer insulation film 22, and is connected to the storage gate 14 through a contact hole 17b. The data-in line 108 is connected to the impurity region 5a through a contact hole 9 formed in the interlayer insulation film 22.

Referring to FIG. 5, a plurality of elements can be provided on the main surface of the substrate 7 between the impurity regions 5b and 5d.

The operation of the memory cell of the three-transistor DRAM described above is identical to that of the memory cell of the three-transistor DRAM with no capacitor which is already described. Therefore, a detailed description thereof will not be repeated here. An improvement in this device is that since the stacked capacitor 15 is provided in the memory cell, the storage capacitance of the memory cell is considerably increased. This enables an enhancement in data holding capability and a reading reliability of the memory cell.

An application of the above-described stacked capacitor to the semiconductor integrated circuit devices other than the DRAM will be described in the following. A dynamic CAM (Content Addressable Memory) having stacked capacitors is taken as an example.

FIG. 6 is a schematic block diagram of a common CAM. Referring to the figure, the CAM includes a CAM array 5000 as a storage region including an arrangement of CAM cells which are unit storage elements, m-bit data register 7000 to which data to be written in the CAM array 5000 or data to be compared with a content stored in the CAM array 5000 is externally supplied, an address decoder 6000 for selecting one of n word lines in the CAM array 5000 in response to an externally applied address signal, a match line sense amplifier 5100 for amplifying a signal appearing on a match line provided for each word of the CAM in data search, a search output register 5200 for storing an output of the match line sense amplifier 5100, and an address encoder 5300 for outputting a stored address of data searched for.

Since the CAM array 5000 is defined by m bit lines and n word lines, the CAM array 5000 can store binary data of n words × m bits.

FIG. 7 schematically shows the arrangement of the CAM cells in the CAM array 5000. Referring to the figure, the CAM array 5000 includes a plurality of bit lines 8a and inverted bit lines 8b, alternately arranged transversely and extending longitudinally, a plurality of word lines 10 and match lines 19, alternately arranged longitudinally and extending transversely, and CAM cells 20 each provided in a region enclosed by a pair of the bit lines 8a and 8b and by a pair of the word line 10 and match line 19, and connected to the bit line pair 8a, 8b, the word line 10 and the match line 19. The match line sense amplifier 100 is connected to one end of the match line 19.

An outline of the operation of the CAM will now be described with reference to FIGS. 7 and 8. In writing, the following operations are sequentially carried out.

(1) Write-in data (m-bit width) is inputted to the data register 7000.

(2) Data in the data register 7000 is applied to all the bit line pairs 8a, 8b in the CAM array 5000.

(3) An external address signal (in a $\log_2 n$-bit width) is inputted to the address decoder 6000, so that the address is decoded to select the corresponding word line.

(4) A potential of "H" is applied to the corresponding word line 10. Data of each of the bit line pairs 8a, 8b, is written into the corresponding CAM cell 20 connected to the selected word line 10.

(5) The potential on the word line 10 is again lowered to "L".

Writing the data into the CAM is here completed, following the above procedure. A detailed method of data storage in the CAM 20 will be described later.

A search operation is one of important functions of the CAM. In the search operation, data previously stored in the CAM array 5000 is compared with search information supplied to the data register 7000, so that an address of data matching with the search information is outputted from the address encoder 5300. The search operation includes the following procedure.

(1) Search information (m-bit width) is inputted to the data register 7000.

(2) Data in the data register 7000 is applied to all the bit line pairs 8a, 8b in the CAM array 5000.

(3) Stored information in each word is compared with the search information applied to the bit line pairs 8a, 8b with respect to n words of the CAM array 5000. The result of the comparison is outputted onto the match line 19.

(4) The match line sense amplifier 5100 amplifies the result of the search outputted onto the match line 19 of each word.

(5) The searched result amplified by the match line sense amplifier 5100 is written into the search output register 5200 for each word. At this time, only the register for the word, in which the stored information and the search information coincide with each other, is set.

(6) The address encoder 5300 outputs an address for the word, in which the stored information and the search information coincide with each other, in response to an output of the search output register 5200.

The reading operation in the CAM will not be described here because such an operation is unnecessary.

One example of the dynamic CAM is proposed in "IEEE Journal of Solid-state Circuits" (Vol. SC-7, pp. 366). Another example is proposed in Japanese Patent Laying Open No. 63-91898. The latter is supposed to be an improved version of the former. That is, the latter has supplemental capacitance whereas the former has none.

Referring to FIG. 8, the memory cell 20 is connected to the word line 10, the bit line 8a, the inverted bit line 8b and the match line 19. The memory cell includes five n channel MOS transistors 11a, 11b, 12a, 12b and 13 and two capacitors 15a and 15b. The transistors 11a and 11b have respective gates 4a, and 4b connected to the word line 10. Respective sources of the transistors 11a and 11b are connected to the bit line 8a and the inverted bit line 8b.

The transistors 12a and 12b have storage gates 14a and 14b connected to drains of the transistors 11a and 11b, respectively. Sources of the transistors 12a and 12b are connected respectively to the bit line 8a and the inverted bit line 8b. A source of the transistor 13 is connected through a node 21 to respective drains of the transistors 12a and 12b.

The transistor 13 has its gate and drain both connected to the match line 19. The transistor 13 functions as a diode.

The capacitors 15a and 15b are connected to the drains of the transistors 11a and 11b, respectively.

A description will be given on writing of data into the above-described CAM cell 20 and on a searching operation of data stored in the CAM cell 20.

Writing operation (1) Complementary data to be written in the cell is supplied to the bit line 8a and to the inverted bit line 8b.

(2) A potential on the word line 10 attains "H". Thus, potentials of the respective transfer gates 4a and 4b of the transistors 11a and 11b attain "H". The transistors 11a and 11b are turned on.

(3) Data corresponding to a potential on the bit line pair 8a, 8b is written in the respective storage gates 14a and 14b of the transistors 12a and 12b.

(4) The potential on the word line 10 falls back to "L". The transistors 11a and 11b are turned off.

(5) Stored information in the cell is held as a stored charge in the gate capacitance of the storage gates 14a and 14b. Since the potentials on the bit line 8a and on the inverted bit line 8b are changed complementarily, signals to be stored in the storage gates 14a and 14b are complementary with each other. This CAM cell 20 is of dynamic type and thus also requires a refresh operation as the DRAM cell does.

Searching operation in the CAM cell 20 will now be described with reference to FIGS. 10.

(1) The bit line 8a and the inverted bit line 8b are precharged to "H".

(2) The match line 19 is precharged to "H". The transistor 13 is turned on, so that a potential on the node 21 attains "H". The match line 19 is rendered electrically isolated from the other elements, i.e., in a floating state.

(3) Search information is applied to the bit line 8a and to the inverted bit line 8b. As described above, the potentials to be supplied to the bit line pair 8a, 8b are complementary.

(4) When the search information coincides with the stored information, the match line 19 is not discharged and thus a potential thereon remains at "H". Conversely, when the search information does not coincide with the stored information, the match line 19 is discharged via the transistor 12a onto the bit line 8a, or is discharged via the transistor 12b onto the inverted bit line 8b, so that the potential on the match line 19 attains "L". A reason for this will be described later.

(5) A plurality of CAM cells 20 are connected to one word line 10. Comparison is made for all the word lines 10 and for all the CAM cells 20.

When there is a mismatch in at least one of the CAM cells connected to one word line 10 with the search information, the match line 19 that is the pair to the word line 10 is discharged through the CAM cell onto the bit line 8a or onto the inverted bit line 8b. The potential on the match line 19 attains "L".

Meanwhile, when all the CAM cells connected to one word line 10 have their stored information coincident with the search information, the match line 19 corresponding to the word line 10 is not discharged. Consequently, the potential on the match line 19 is maintained at "H".

Therefore, detecting the match line 19 remaining at "H" makes it possible to specify a word in which data coincident with the search information is stored.

The following description is the reason why the potential on the match line 19 remains at "H" only when the search information is coincident with the stored information. A case is taken as an example where data of "H" is stored in the storage gate 14a, while that of "L" is stored in the storage gate 14b.

(1) Suppose that the data of "H" and that of "L" are applied to the bit line 8a and to the inverted bit line 8b, respectively. The source and drain of the transistor 12a have the same potential, so that the transistor 12a is not turned on. The storage gate 14b of the transistor 12b is at "L", so that the transistor 12b is not turned on either. Thus, the charge on the match line 19 does not flow anywhere, and thus the potential thereon is kept at "H".

(2) Suppose that "L" and "H" are supplied to the bit line 8a and to the inverted bit line 8b, respectively. The transistor 12a has the storage gate 14a at "H", the source at "L" and the drain (the node 21) at "H", so that the transistor 12a is turned on. The charge on the match line 19 is lead out of the node 21 via the transistor 12a onto the bit line 8a. The potential on the match line 19 attains "L".

As aforementioned, the potential on the match line 19 remains at "H" in the case of the coincidence, while it attains "L" in the case of the incoincidence.

Conversely, suppose that the data of "L" and that of "H" are stored in the storage gates 14a and 14b, respectively. In this case, when the stored information is not coincident with the search information, the transistor 12b is turned on. The charge on the match line is thus lead out onto the inverted bit line 8b, and thus the potential thereon attains "L". On the other hand, when the stored information is coincident with the search information, the node 21, i.e., the potential on the match line 19 remains at "H".

Therefore, the potential of "H" appears on the match line 19 only when the data stored in the storage gates 14a and 14b are coincident with the data applied to the bit line pair 8a, 8b. Since the information is stored in the storage gates 14a and 14b in the form of the stored charge, it is preferable, needless to say, that the amount of the stored charge is stable. Meanwhile, similarly to the case of the three-transistor DRAM cell described above, the storage gates 14a and 14b are capacitively coupled to the drain or the source. Potentials of the storage gates 14a and 14b are susceptible to a potential fluctuation on the drain or source. Data is also liable to be destroyed due to soft error or the like because the charge is small in amount stored on the gate capacitance alone. In either case, a reduced potential difference causes a degradation in reliability in data reading. A frequent repetition of the refresh operation is also required.

Similarly to the case of the DRAM, it is effective to add the supplemental capacitors 15a, 15b other than the gate capacitance in order to increase the storage capacitance.

Note that a circuit diagram of a dashed-box B in FIG. is identical to the circuit diagram of FIG. 4 described above. Therefore, a cross sectional view showing a structure of the dashed-box B is the same as that of FIG. 5; it should be noted that the data-in line 108 in FIG. 5 is replaced by the bit line 8a in FIG. 8.

As is obvious from the foregoing description, referring to FIG. 5 again, when the storage node 1 need be electrically connected to the storage gate 14 of the MOS transistor 12, following elements are required: an interconnection 16 for connecting the storage gate 14 and the N+ impurity region 5b to which the storage node 1 is connected, and a contact hole 17a for coupling the interconnection 16 and the N+ impurity region 5b. A contact hole 17b for connecting the interconnection 16 and the storage gate 14 is also required.

In many cases other than the above-described case, a capacitor is often electrically connected to a conductive layer other than the impurity region to which the capacitor is directly connected. FIGS. 9 and 10 are circuit diagrams of such an example.

FIGS. 9 and 10 show circuit diagrams of an analog multiplier as another example of the semiconductor integrated circuit device with stacked capacitors. Referring to FIG. 9, the analog multiplier includes a switch SW1 for connecting/disconnecting an input terminal T1 and a node NA in synchronization with a clock signal $\phi1$, a switch SW2 provided between the node NA and a ground potential GND for connecting/disconnecting them in synchronization with a clock signal $\phi2$, a capacitor C1 with one electrode connected to the node NA and the other electrode connected to a node NB, a switch SW3 provided between the node NB and the ground potential GND for connecting/disconnecting them in synchronization with the clock signal $\phi2$, a capacitor C2 provided between the node NB and the ground potential GND, and an operational amplifier OP1 with its non-inverting input terminal connected to the node NB and its inverting input terminal connected to an output thereof. The operational amplifier OP1 forms voltage follower connection and outputs a potential on the node NB to an output Vout as it is.

An operation of the analog multiplier shown in FIG. 9 will now be described. FIG. 11 is a timing chart showing a relationship among the clock signals $\phi1$ and $\phi2$, an input voltage Vin from the input terminal T1, and the output Vout of the operational amplifier OP1. Referring to FIGS. and 11, the clock signal $\phi2$ first attains "H", so that the switches SW2 and SW3 are turned on. Potentials on the nodes NA and NB thus both attain 0 V. The output Vout is 0 V at this time. The clock signal $\phi2$ subsequently attains "L". Accordingly, the switches SW2 and SW3 are turned off. The clock signal $\phi1$ attains "H", so that the switch SW1 is turned on. The input voltage Vin is applied to the node NA. Capacitive coupling of the capacitor C1 changes the potential on the node NB to a value shown in the following expression.

$$Vin \times C1/(C1+C2) \tag{1}$$

Since the operational amplifier OP1 forms the voltage follower connection as described above, the potential on the node NB is outputted to the output Vout as it is.

The relationship between capacitances of the capacitors C1 and C2 in the above described analog multiplier is shown below.

$$C1 = k \times C2 \tag{2}$$

At this time, the relationship between Vin and Vout is shown by the following equation.

$$Vout = Vin \times k/(k+1) \tag{3}$$

As obviously shown in the expression (3), an output voltage Vout produced by multiplying the input voltage Vin by an arbitrary factor can be obtained by changing the value of k.

In the circuit diagram shown in FIG. 10, an N channel transistor 35 is employed as the switch SW1. An N channel transistor 36 is employed as the switch SW2. An N channel transistor 37 is employed as the switch SW3. A portion enclosed by a chain dotted line in FIG. 10 constitutes the operational amplifier OP1. Since the operational amplifier OP1 is not directly related to the present invention, its structure and operation will not be described here in detail. However, it should be noted that the operational amplifier OP1 includes a P channel transistor 49 with its gate connected to the node NB. A reference voltage Vref1 in the circuit diagram is employed as a reference voltage for limiting a current flowing through the operational amplifier OP1.

Referring to FIG. 10, a circuit portion o shown by the dashed line includes the transistors 37 and 49 and the capacitor C2 and has the configuration similar to that of the circuit A shown in FIG. 3. Therefore, the circuit portion $\alpha$ is implemented with the structure shown in the cross sectional view of FIG. 5. In an analog multiplier, all the capacitors C1, C2 and C3 are required to have considerably large capacitances. The area required for the capacitors C1–C3 are thus large. It will be possible to substantially reduce the area occupied by the circuit portion α if the stacked capacitor is reduced in area.

The semiconductor integrated circuit device with the conventional stacked capacitor is structured as described above, and is more effective for enhancements in the degree of integration and in reliability than the one without capacitor. However, as the degree of integration of the semiconductor integrated circuit device is getting higher, the following problems are still to be solved.

For example, in the case where the storage node is electrically connected to the conductive layer other than a diffusion region to which the storage node is directly connected, an interconnection is required for connecting the diffusion region and the conductive layer. A contact hole is further required for coupling the diffusion region and the interconnection. The provision of the interconnection and the contact hole causes an inevitable increase in a lay-out area of the semiconductor integrated circuit device, resulting in high cost as well as prevention of the higher degree of integration.

It is impossible to form the stacked capacitor where the contact hole is provided. Therefore, there is a limitation in increasing the storage capacitance of the stacked capacitor. This is one of other factors of preventing the higher degree of integration of the semiconductor integrated circuit device.

Further, the provision of the contact hole for the interconnection causes an increase in the area of the diffusion region to which the storage node is connected. In addition, the area of a PN junction between the diffusion region and the semiconductor substrate 7 is also increased, so that the stored charge becomes liable to leak in this area, thereby decreasing reliability in operation.

SUMMARY OF THE INVENTION

The semiconductor integrated circuit device having the conventional stacked capacitor has the foregoing problems. Therefore, it is an object of the present invention to provide a semiconductor integrated circuit device having a capacitor element, which can have a higher integration and can operate with a higher reliability, and to provide a manufacturing method therefor.

It is another object of the present invention to provide a semiconductor integrated circuit having a capacitor element, which can be integrated with a higher degree and can store a larger amount of charge, and to provide a manufacturing method therefor.

It is a further object of the present invention to provide a semiconductor integrated circuit device having a capacitor element, which can be integrated higher and can have a larger area of a storage electrode, and to provide a manufacturing method therefor.

It is a still further object of the present invention to provide a semiconductor integrated circuit device having a capacitor element, which can attain a higher degree of integration and have less leakage from a storage electrode, and to provide a manufacturing method therefor.

It is still another object of the present invention to provide a semiconductor integrated circuit device which occupies the smaller amount of area on a main surface, for an impurity region to which a storage electrode is connected, and to provide a manufacturing method therefor.

According to the present invention, the above objects and the other objects can be accomplished by providing the semiconductor integrated circuit device including: a semiconductor substrate having a main surface; a first conductive region formed at the main surface; a second conductive region which is formed at the main surface spaced apart from the first conductive region and is to be electrically connected to the first conductive region; and a capacitor having a capacitive element connecting the first and second conductive regions.

According to a preferred embodiment of the present invention, the capacitor includes a first electrode layer for electrically connecting the first and second conductive regions, a dielectric film formed on the first electrode layer, and a second electrode layer formed on the dielectric film.

In the semiconductor integrated circuit device of the above-described structure, the first and second conductive regions are electrically connected to each other by the first electrode layer. At the same time, the first electrode layer forms the capacitor, together with the dielectric film and the second electrode layer. Since the first electrode layer, which is a portion of the capacitor, can be also utilized as an interconnection, a separate interconnection is not required. In addition, the number of necessary contact holes is reduced by at least one. Compared with the case where the separate interconnection is provided, there are fewer obstacles to the formation of the capacitor element. Conversely, since a portion of the interconnection can be utilized as a storage electrode, a capacitor element with a larger capacitance can be formed.

Thus, it becomes possible to increase the amount of charge stored in the capacitor element and also decrease the amount of area of the semiconductor integrated circuit device.

According to another aspect of the invention, a memory cell according to the present invention includes: first, second, third and fourth signal lines; two pairs of MOS transistors, each pair capable of acting independently of the other.

A first of the pairs includes a first MOS transistor controlled by the first signal and having two electrodes one of which is connected to the second signal line, a second MOS transistor having the gate connected to the other electrode of the first MOS transistor, and having two electrodes one of which is connected to the second signal line, and a first capacitor having a capacitive element connecting the first and second MOS transistors.

A second of the pairs includes a third MOS transistor controlled by the first signal line and having two electrodes one of which is connected to the third signal line, a fourth MOS transistor having the gate connected to the other electrode of the third MOS transistor and having two electrode, one of which is connected to the third signal line, and a second capacitor having a capacitive element connecting the third MOS transistor and the fourth MOS transistor.

The memory cell further includes a fifth MOS transistor connecting the third and fourth MOS transistors to the fourth signal line and having its own gate connected to the fourth signal line.

According to still another aspect of the present invention, the method of manufacturing the semiconductor integrated circuit device includes the steps of: forming a first conductive region on a main surface of a semiconductor substrate; forming a second conductive region on the main surface with a predetermined first space apart from the first conductive region; forming an insulator layer on the first and second conductive regions; forming a first opening in the insulator layer on the first conductive region, and forming a second opening in the insulator layer on the second conductive region; forming a first electrode layer in the insulator layer and within the first and second openings so that at least a portion of the first electrode layer contacts the first conductive region and another portion contacts the second conductive region; forming a dielectric film on the first electrode layer; and forming a second electrode layer on the dielectric film.

In the semiconductor integrated circuit device manufactured by the above method, the first and second conductive regions are mutually connected by the first electrode layer. The first electrode layer, the dielectric film and the second electrode layer together form a capacitor element. Since the first electrode layer interconnects the first and second conductive regions, an independent interconnection for connecting the first and second conductive regions is not required. Since the capacitor element can be formed extending over the first and second conductive regions, the area of the capacitor element is markedly increased compared to the conventional one. The amount of stored charge in the capacitor element is also considerably increased, resulting in a higher degree of integration of the semiconductor integrated circuit device as well as a higher reliability in operation thereof.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
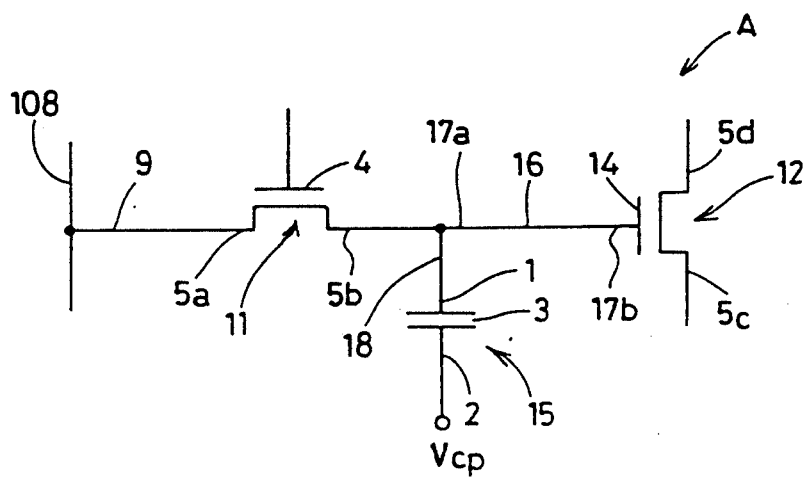
FIG. 4 is an enlarged circuit diagram of a main portion of the circuit shown in FIG. 3.
Figure 12:
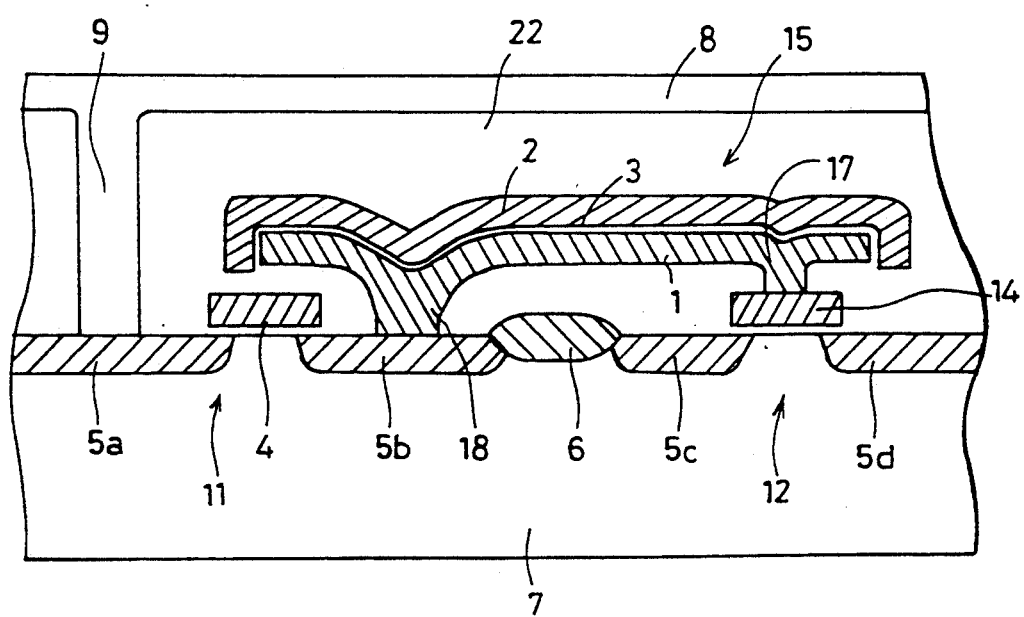
FIG. 12 is a cross sectional view of a main portion showing a structure of a semiconductor integrated circuit device according to a preferred embodiment of the present invention.

FIG. 12 shows the structure of the portion, in the semiconductor integrated circuit device, corresponding to the circuit diagram shown in FIG. 4. Therefore, the semiconductor integrated circuit device of this preferred embodiment is applicable to the CAM cell shown in FIG. 8. An example of the application will be described later with reference to the figures.

Referring to FIG. 12, the semiconductor integrated circuit device in accordance with the present invention includes a P type semiconductor substrate 7, N channel MOS transistors 11 and 12 formed on a main surface of the semiconductor substrate 7 spaced apart from each other by an isolation region 6, and a stacked capacitor 15 for connecting a gate of the transistor 12 and the transistor 11 and simultaneously functioning as a capacitor element. An interlayer insulation film 22 is formed on these semiconductor compounds, and a bit line 8 made of polysilicon or metal is formed on the interlayer insulation film 22.

The transistor 11 includes $N^+$ impurity regions $5a$ and $5b$, spaced apart from each other, formed in one region on the main surface of the substrate 7, which region is isolated by the isolation region 6, and includes a transfer gate 4 formed on a region of the substrate 7 between the impurity regions $5a$ and $5b$. A gate insulator film is sandwiched between the gate 4 and the substrate 7.

The transistor 12 includes $N^+$ impurity regions $5c$ and $5d$, spaced apart from each other, formed in the other region on the main surface of the substrate 7, which region is isolated by the isolation region 6, and includes a storage gate 14 formed on a region of the substrate 7 between the impurity regions $5c$ and $5d$. A gate insulator film is sandwiched between the gate 14 and the substrate.

The stacked capacitor 15 includes a storage node 1 made of polysilicon or the like connected to the impurity region $5b$ through a contact hole 18 and to the storage gate 14 through a contact hole 17, a thin dielectric film 3 formed on the storage node 1, and a cell plate 2 made of polysilicon or the like, formed on the dielectric film 3 to cover the storage node 1. The thickness of the storage node 1 is sufficient for conducting current therethrough.

The impurity region 5a and the bit line 8 are connected to each other through a contact hole 9 formed in the interlayer insulation film 22.

Figure 15:
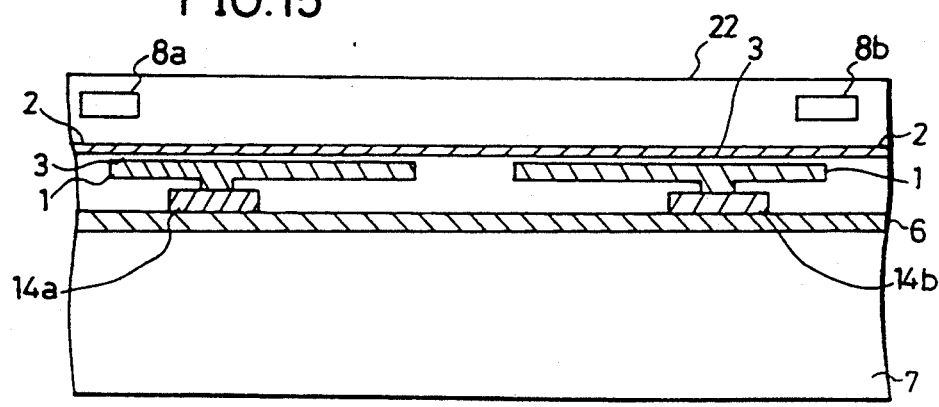
FIG. 15 is a cross sectional view taken in the direction of the arrows XV—XV of FIG. 1A.

As described above, the circuit diagram corresponding to the semiconductor integrated circuit device shown in FIG. 12 is shown in FIG. 15. Thus, the structure of the circuit in FIG. 4 is immediately applicable to three-transistor DRAM cells, CAM cells and the like. The operation of this circuit has already been described and hence the description thereof will not be repeated here.

Features of the structure shown in FIG. 12 are such that the area of a charge storing portion of the stacked capacitor 15 is markedly increased compared to the conventional one, and that despite this considerable increase, the area of the integrated circuit device can be reduced.

The storage node 1 serves as an interconnection for the impurity region 5b and the storage gate 14 as well as serving as one electrode of the stacked capacitor 15. Neither the interconnection 16 shown in FIG. 5 nor the contact hole 17a for connecting the interconnection 16 (shown in FIG. 5) to the impurity region 5b is required. The area of the impurity region 5b in the transverse direction can be reduced by the area required for the interconnection 16 and the contact hole 17a. Since the area of a PN junction at an interface of the impurity region 5b and the semiconductor substrate 7 becomes reduced in amount, a leakage from this portion becomes decreased. The charge is held more steadily in the storage node 1, and the reliability of the operation of the circuit having this structure is improved.

Omission of the separate interconnection 16 results in such effects as follows. Conventionally, when the portion of the stacked capacitor 15 for storing the charge is to be enlarged, this enlargement has been limited due to the presence of the interconnection 16. In the semiconductor integrated circuit device of the present invention, however, there is no obstacle to the enlargement of the charge storing region of the stacked capacitor 15. Therefore, it becomes possible to provide the storage node 1 and the cell plate 2 extending over the transistor 11 and the transistor 12, as shown in FIG. 12. The area of the storage node 1 becomes markedly increased compared to the conventional, so that it becomes possible to secure a sufficient storage capacitance even when the semiconductor integrated circuit device is further integrated.

Employing a capacitor element having such a structure in the semiconductor integrated circuit device can offer a higher degree of integration and of a higher reliability in operation of the device. Conventionally, it has been difficult to further integrate some kind of device because its structure requires a large capacitance. The structure shown in FIG. 12, however, makes it possible to further integrate such a device. This also enables a considerable reduction of cost.

Figure 5:
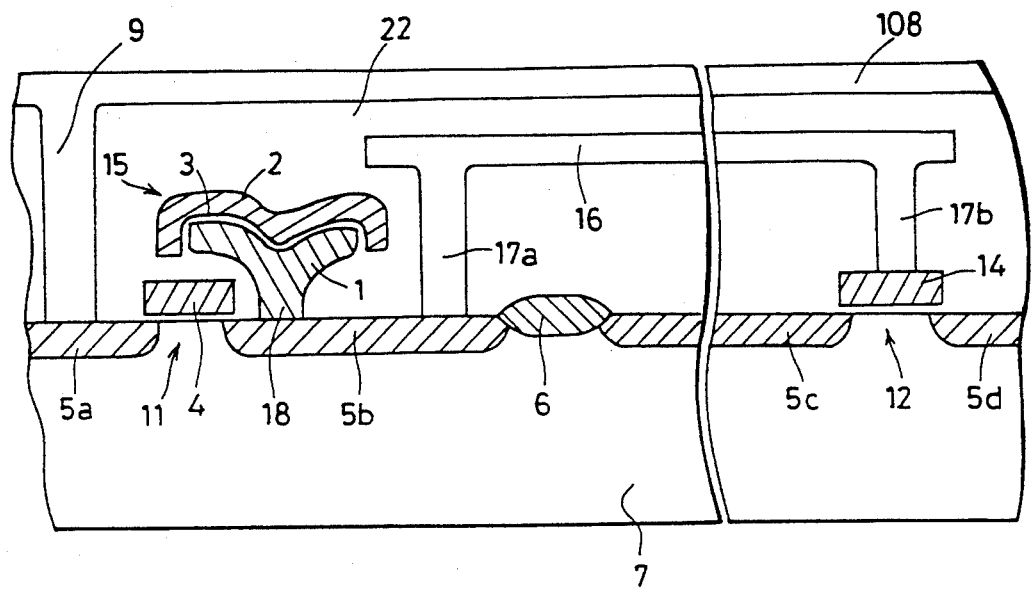
FIG. 5 is a cross sectional view of a conventional semiconductor integrated circuit device corresponding to the circuit diagram shown in FIG. 4.
Figure 6:
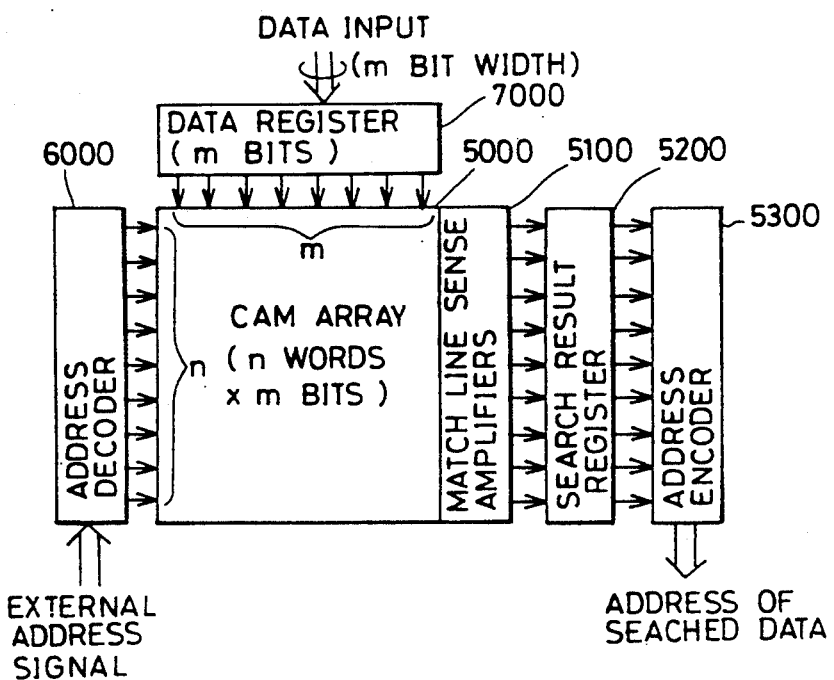
FIG. 6 is a block diagram of a conventional CAM.
Figure 7:
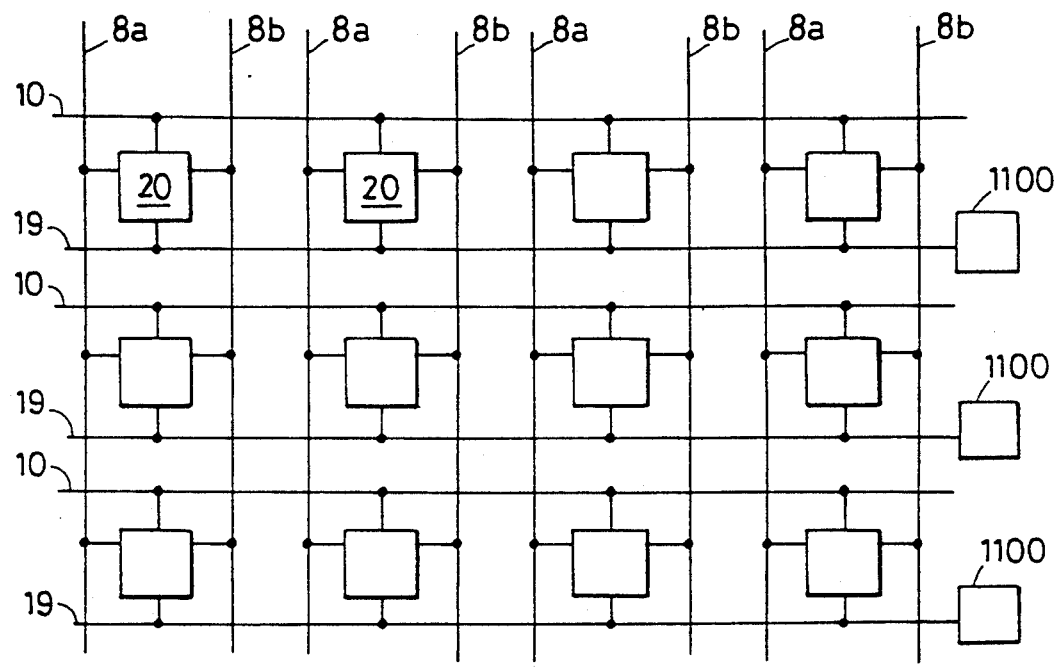
FIG. 7 is a schematic plan view showing an arrangement of CAM cells in a CAM array.

The semiconductor integrated circuit device shown in FIG. 12 is equivalent to the one shown in FIG. 5. Since a storage capacitance of the stacked capacitor 15 itself is considerably increased compared to the conventional, and also the contact hole 17a for the interconnection 16 need not be provided, the area of the impurity region 5b can be reduced. A leakage out of the PN junction at the interface between the impurity region 5b and the semiconductor substrate 7 becomes also decreased, which substantially reduces a potential change in the storage node 1 compared to the conventional, together with the marked increase in the stored charge.

Figure 13A:
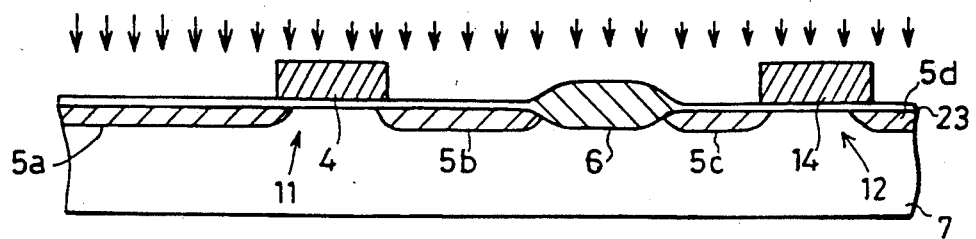
FIGS. 13A–13D are cross sectional views of the main portion showing the steps of manufacturing the semiconductor integrated circuit device shown in FIG. 12.

The device shown in FIG. 12 is manufactured by the following process. Referring to FIG. 13A, the isolation region 6 made of a thick oxide film (with a thickness of approximately 6000Å) is formed by selectively oxidizing the main surface of the P type semiconductor substrate 7 with an impurity concentration of $1 \times 10^{15} \sim 1 \times 10^{16}$ cm$^{-3}$.

A gate oxide film 23 of the N channel MOS transistors 11 and 12 is formed to a thickness of approximately 200Å in an active region where the isolation region 6 is not formed. Polysilicon is deposited to a thickness of approximately 5000Å by a CVD (Chemical Vapor Deposition) method. The transfer gate 4 of the transistor 11 and the storage gate 14 of the transistor 12 are formed by dry etching the polysilicon layer, employing a resist as mask. The N+ impurity regions 5a-5d are formed by ion-implanting arsenic to the doped amount of approximately $1 \times 10^{16}$ cm$^{-2}$.

Figure 13B:
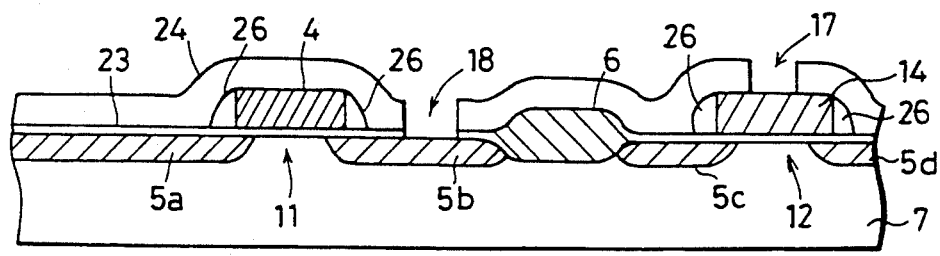

Referring to FIG. 13B, an oxide film is deposited to a thickness of about 5000Å by the CVD method. Dryetching this oxide film leaves sidewalls 26 only at edges of the transfer gate 4 and storage gate 14. An oxide film 24 is deposited to a thickness of about 5000Å over the whole surface of the semiconductor compounds by the CVD method. Dry etching the oxide film 24 with the resist employed as mask results in the formation of the contact holes 17 and 18.

Figure 13C:
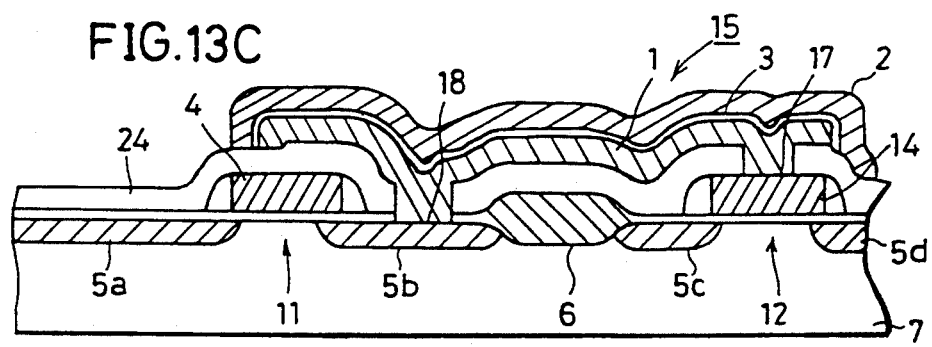

Referring to FIG. 13C, a polysilicon layer is deposited to a thickness of about 2000Å by the CVD method. The storage node 1 is formed by dry etching this polysilicon layer with the resist employed as mask. Depositing a nitride film in a thickness of about 100Å on the storage node 1 leads to the formation of the dielectric film 3 of the stacked capacitor 15. A polysilicon layer is deposited to a thickness of about 2000Å on the dielectric film 3 by the CVD method. Wet etching this polysilicon layer, employing the resist as masks results in the formation of the cell plate 2 and consequently the stacked capacitor 15.

Figure 13D:
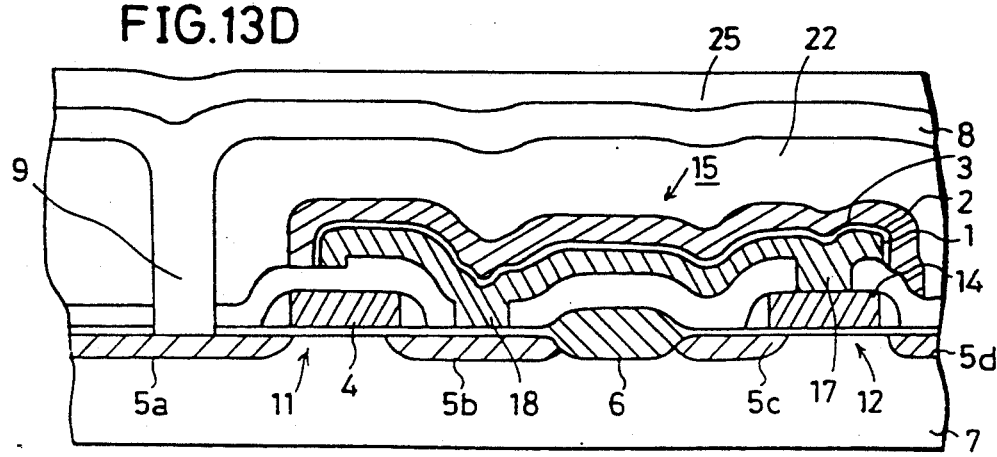

Referring to FIG. 13D, the thick interlayer insulation film 22 is deposited on the stacked capacitor 15. A contact hole 9 is formed on the impurity region 5a by dry etching the interlayer insulation film 22, employing the resist as mask. AlSi alloy is evaporated over the whole surface of the interlayer insulation film 22 by sputtering. The bit line 8 is formed by etching the evaporated metal, employing the resist as mask. A nitride film 25 for protecting a chip is formed thereon by the CVD method at a low temperature.

The semiconductor integrated circuit device shown in FIG. 12 is thus manufactured according to the above steps.

Figure 8:
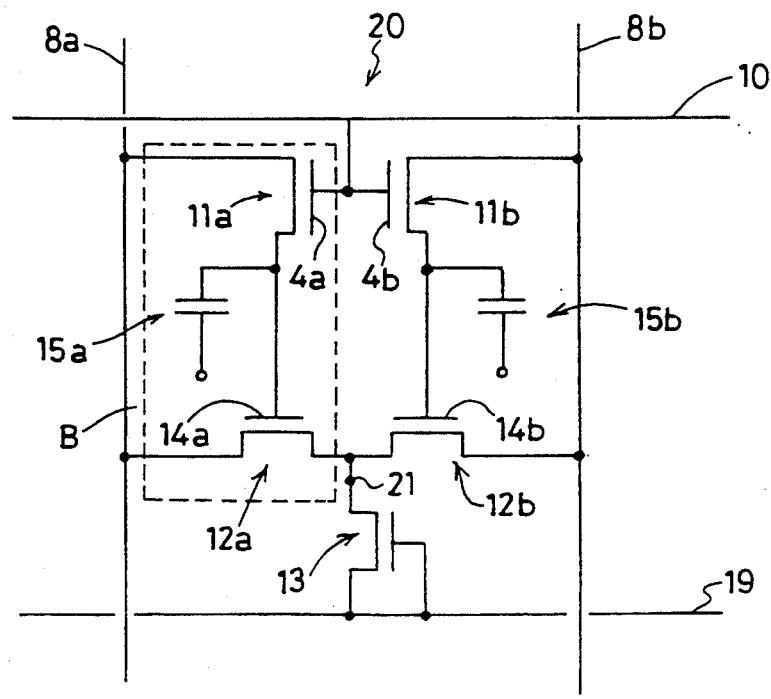
FIG. 8 is an equivalent circuit diagram of a CAM cell having a capacitor.
Figure 9:
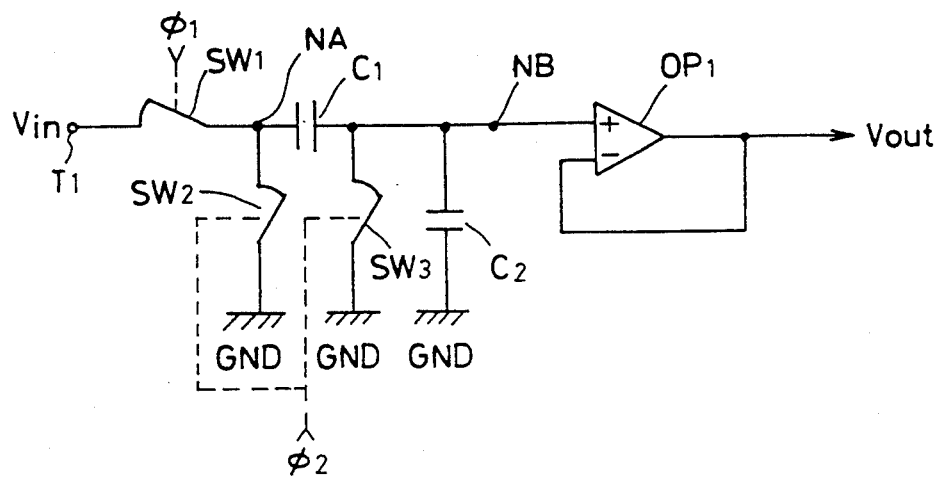
FIG. 9 is a simplified circuit diagram of a conventional analog multiplier.
Figure 14A:
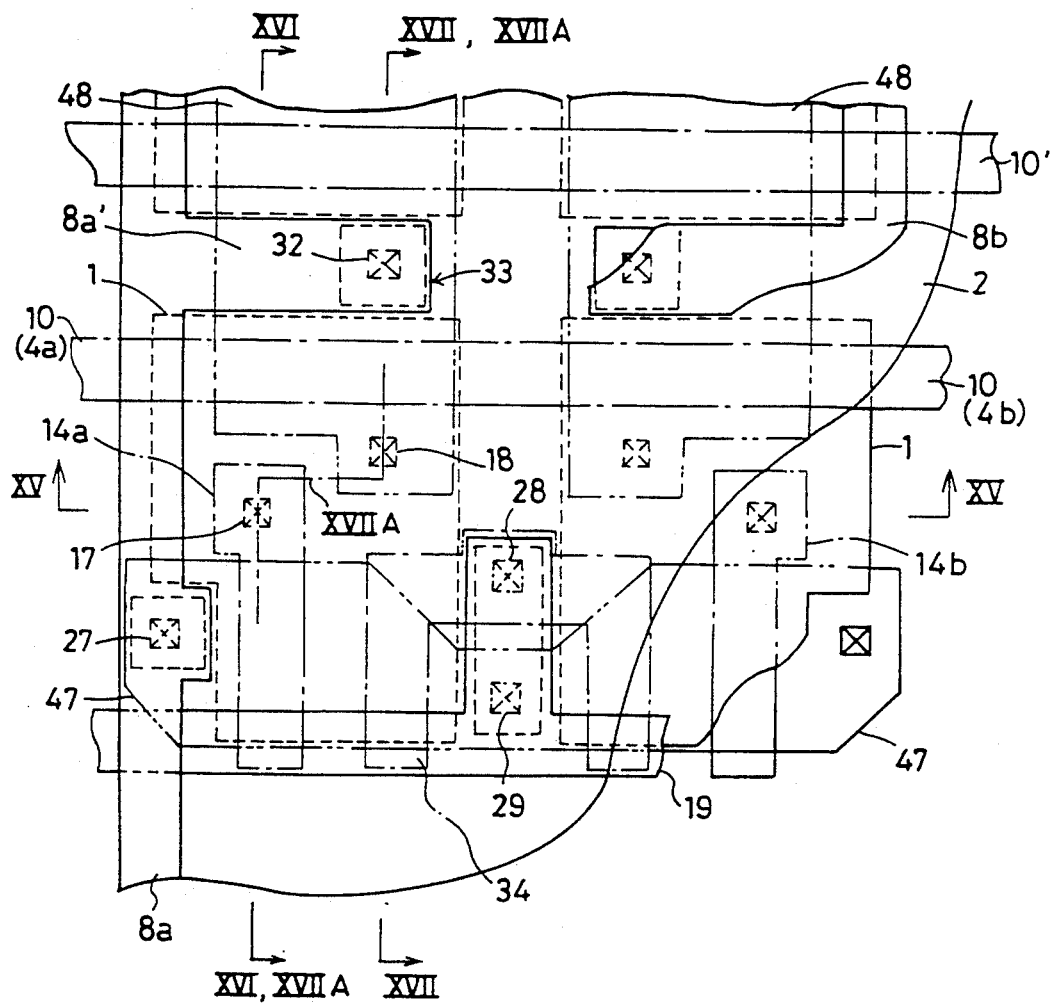
FIG. 14A is a partially cut-away plan view of a CAM cell to which the present invention is applied.
Figure 14B:
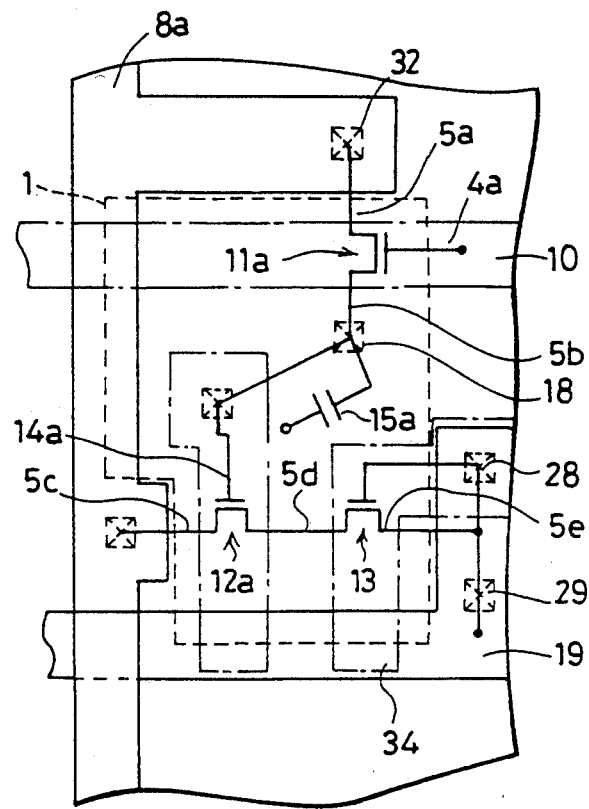
FIG. 14B is a schematic plan view showing an arrangement of elements in the left half of FIG. 14A.

FIG. 14A is a schematic plan view of the CAM cell in which the method of the semiconductor integrated circuit device according to the present invention is applied to the CAM cell shown in the circuit diagram of FIG. 8. FIG. 14B is a schematic plan view for representing an arrangement of elements provided in the left half of the CAM cell shown in FIG. 14A.

With reference to FIGS. 14A-17A, the CAM cell as the second preferred embodiment of the present invention has a planar form which is horizontally symmetrical. In this CAM cell, an isolation region 6 for defining active regions 47 and 48 is formed on a P type semiconductor substrate 7. N+ impurity regions 5a and 5b are formed in the active region 48 in the transverse direction of FIG. 14A. N+ impurity regions 5c, 5d and 5e are formed in the active region 47 in the longitudinal direction of FIG. 14A.

A word line 10 transversely extending is formed over a region between the impurity regions 5a and 5b in the main surface of the substrate 7 with a gate oxide film sandwiched therebetween. A word line 10' shown in FIG. 14A belongs to the adjacent CAM cell provided above the present CAM cell. A storage electrode 14a is formed between the impurity regions 5c and 5d on the active region 47 in the longitudinal direction of FIG. 14A. A gate oxide film is formed between the electrode 14a and the substrate. An inverted L-shaped gate electrode 34 (FIG. 14B) is formed on the active region 47 between the impurity regions 5d and 5e over the semiconductor substrate 7. A gate oxide film is sandwiched between the electrode and the substrate.

A storage node 1 made of polysilicon is formed over the storage electrode 14a, the gate electrode 34 and the impurity regions 5b, 5c, 5d and 5e. The storage node 1 is connected to the storage gate electrode 14a through a contact hole 17 and to the impurity region 5b through a contact hole 18. A cell plate 2 made of polysilicon is formed on the storage node 1. A dielectric film 3 is sandwiched between the cell plate 2 and the storage node 1. The cell plate 2 covers the overall surface of a portion where the CAM array of this semiconductor integrated circuit device is formed.

A match line 19 made of polysilicon transversely extends over end portions of the active region 47 in the CAM cell. The match line 19 is projecting over at the center of the CAM cell. A bit line 8a made of polysilicon longitudinally extends along the upper left edge of the CAM cell. A bit line 8a' for connection, stretching from the bit line 8a to and over the active region 48, is provided to be connected to the impurity region 5a through a contact hole 32. A space 33 for forming the contact hole 32 is provided in the cell plate 2 around the contact hole 32. Similarly, spaces for making contact holes are formed in required portions of the cell plate 2. The bit line 8a' is connected through a contact hole 27 to the impurity region 5c of the active region 47.

The match line 19 is connected through a contact hole 29 to the center of the active region 47, i.e, the impurity region 5e. The match line 19 is also connected through a contact hole 28 to the gate electrode 34. The right half of the CAM cell is symmetrical to the left half thereof in FIG. 14A; however, suffixes "b" are added to the elements in the right half to replace the suffixes "a" added to the elements in the left half.

Especially referring to FIGS. 14B and 14C, an N channel transistor 11a is formed below the word line 10. An N channel transistor 12a is formed below the storage gate 14a. An N channel transistor 13 is formed below the gate electrode 34.

The impurity region 5b which is one of the terminals of the transistor 11a is connected through the contact hole 18, the storage node 1 and the contact hole 17 to the storage gate 14a of the transistor 12a. The transistor 12a and a source of the transistor 13 are connected to each other in the impurity region 5d. The transistor 13 has its gate electrode and its drain connected to the match line 19 through the contact hole 28, and through the impurity region 5e and the contact hole 29, respectively.

The storage node 1, the dielectric film 3 and the cell plate 2 together form a stacked capacitor 15a. Thus, the equivalent circuit diagram of the CAM cell shown in FIG. 14A is equal to the one shown in FIG. 14C.

Figure 14C:
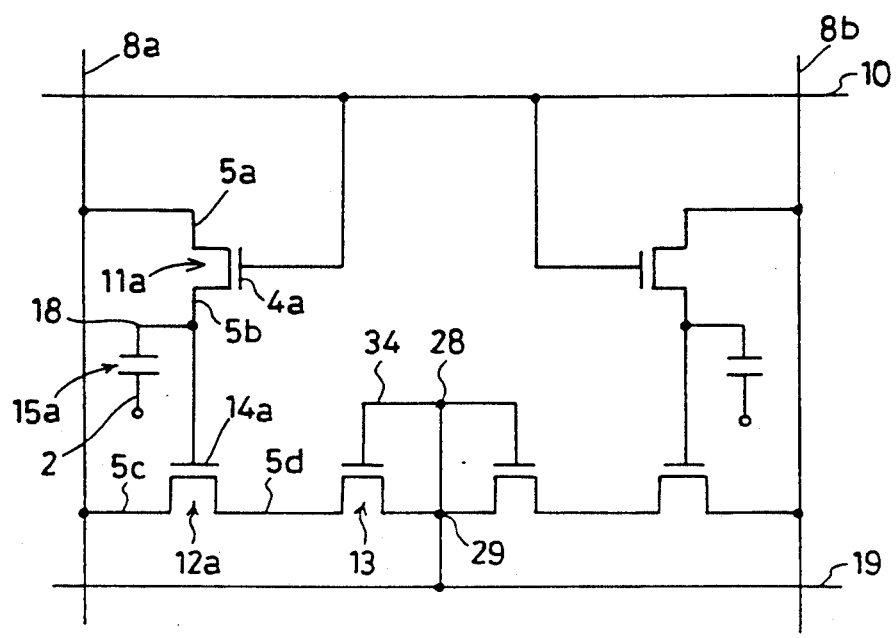
FIG. 14C is an equivalent circuit diagram of the CAM cell of FIG. 14A.
Figure 16:
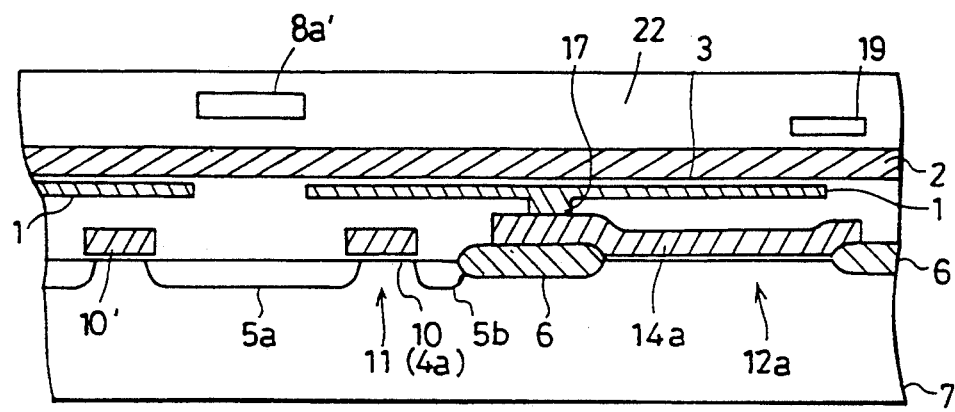
FIG. 16 is a cross sectional view taken in the direction of the arrows XVI—XVI of FIG. 14A.

The equivalent circuit diagram of the CAM cell shown in FIG. 14C is identical to the one shown in FIG. 8. The operation thereof has already been described, and hence the description thereof will not be repeated here.

A feature of this CAM cell is that the area of the storage node 1 is extremely large. The storage node 1 as an interconnection for the transistor 11a and the storage gate 14a of the transistor 12a makes the above-mentioned enlargement possible. That is, since a separate interconnection need not be provided, it is possible to extremely enlarge the area of the storage node 1.

The enlarged area allows the amount of charge stored in the storage node 1 to be considerably increased compared to that in the case of the conventional stacked capacitor. The charge stored in the storage gate electrode 14a and in the capacitor 15a in the CAM cell is sufficient to obtain a semiconductor integrated circuit device which can operate with enough reliability even when further integrated.

Figure 17:
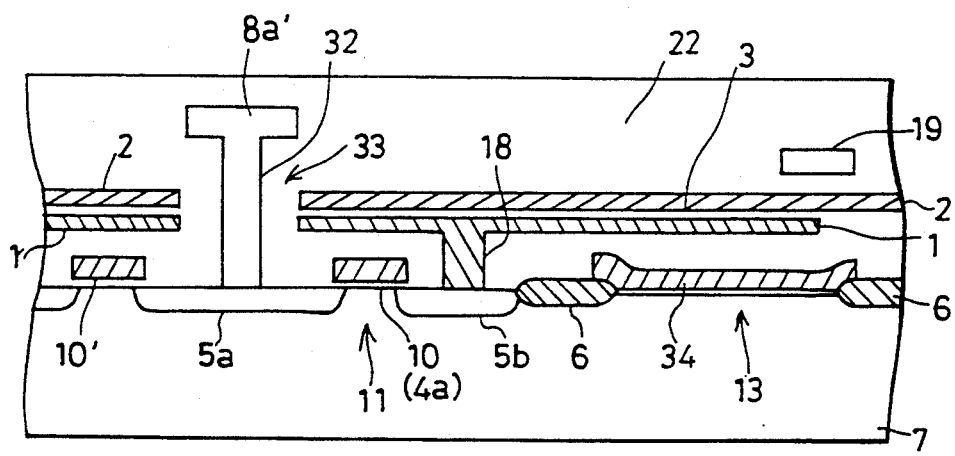
FIG. 17 is a cross sectional view taken in the direction of the arrows XVII—XVII of FIG. 14A.
Figure 17A:
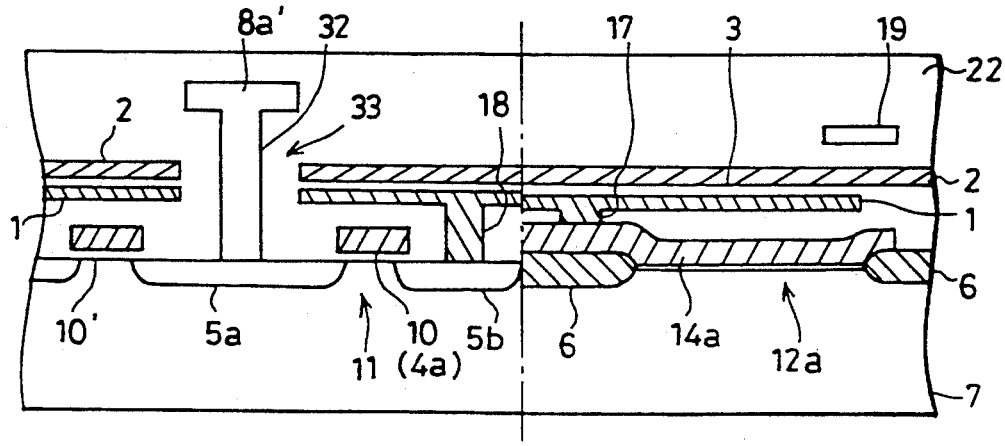
FIG. 17A is a cross sectional view taken in the direction of the arrows XVIIA—XVIIA of FIG. 14A.
Figure 18:
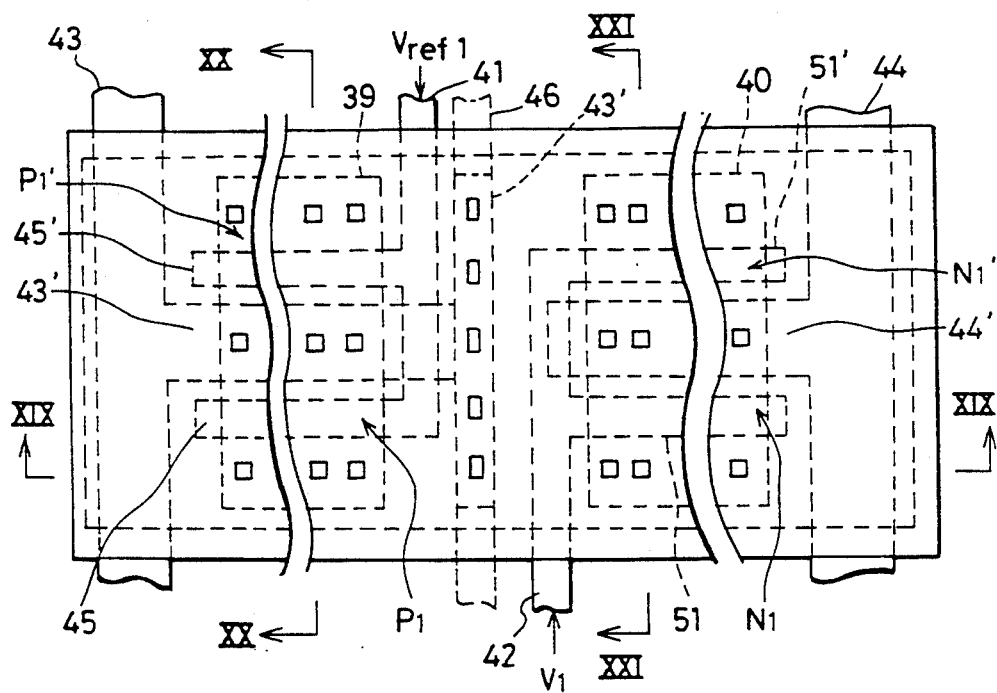
FIG. 18 is a plan view showing a main portion of the analog multiplier according to the fourth preferred embodiment of the present invention.
Figure 19:
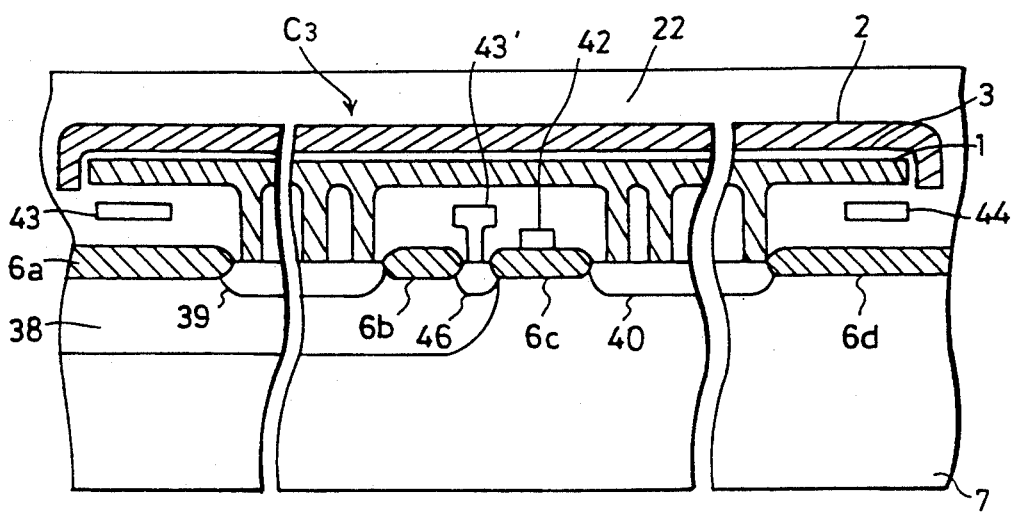
FIG. 19 is a cross sectional view taken in the direction of the arrows XIX—XIX of FIG. 18.
Figure 20:
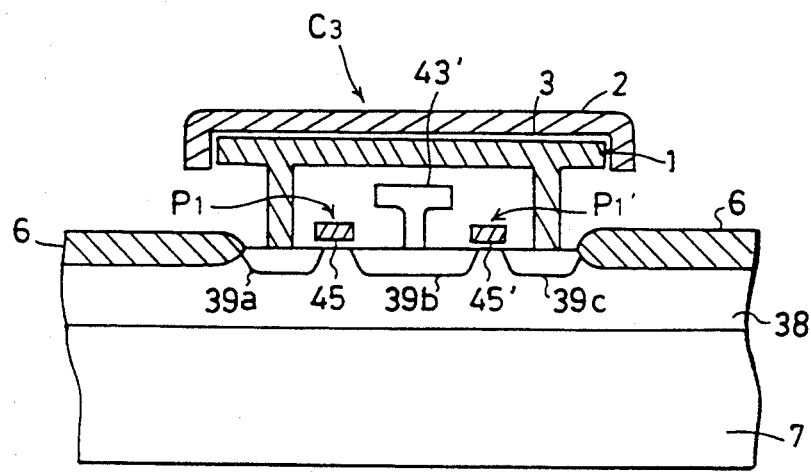
FIG. 20 is a cross sectional view taken in the direction of the arrows XX—XX of FIG. 18.
Figure 21:
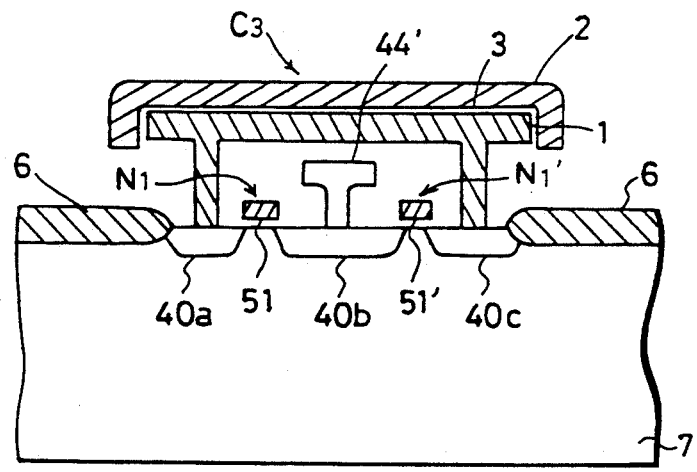
FIG. 21 is a cross sectional view taken in the direction of the arrows XXI—XXI of FIG. 18.

With particular reference to FIG. 17A, there is explicitly shown a structure similar to that shown in FIG. 12.

Figure 1:
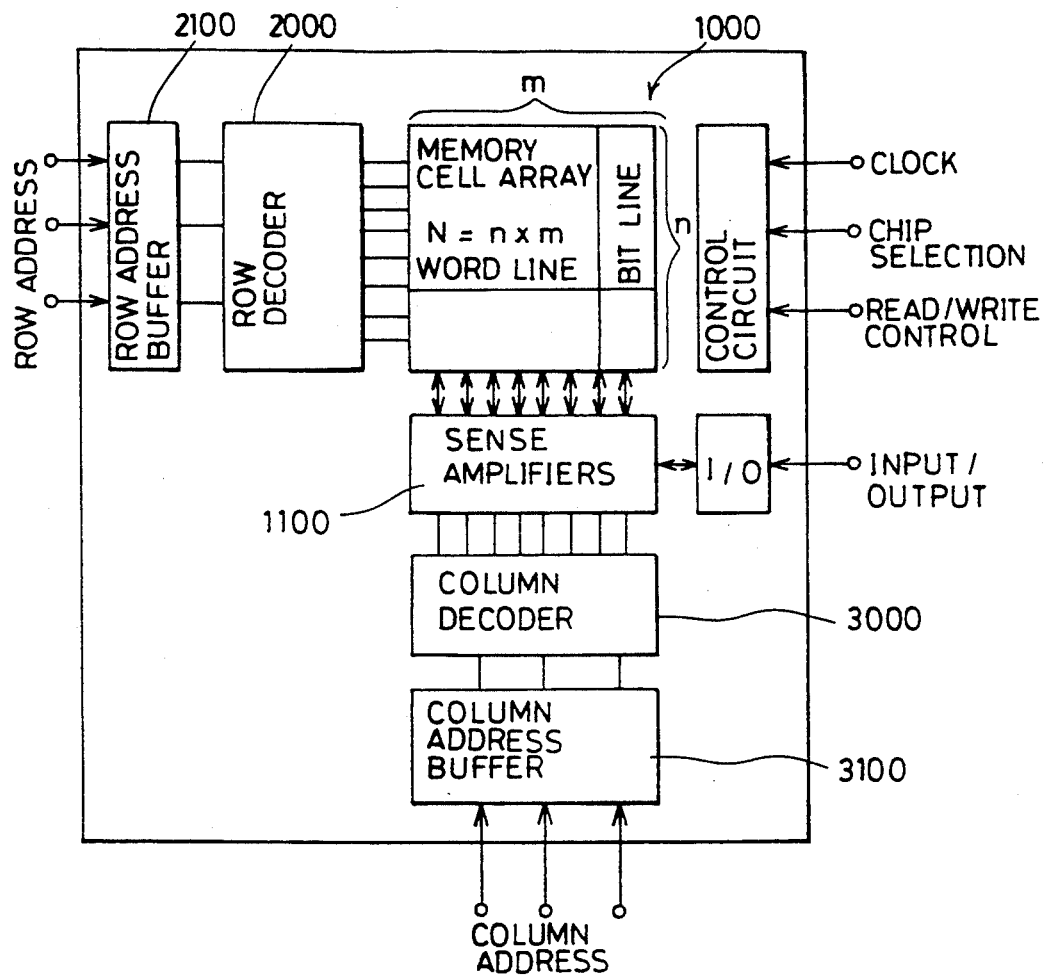
FIG. 1 is a block diagram of a conventional DRAM.
Figure 2:
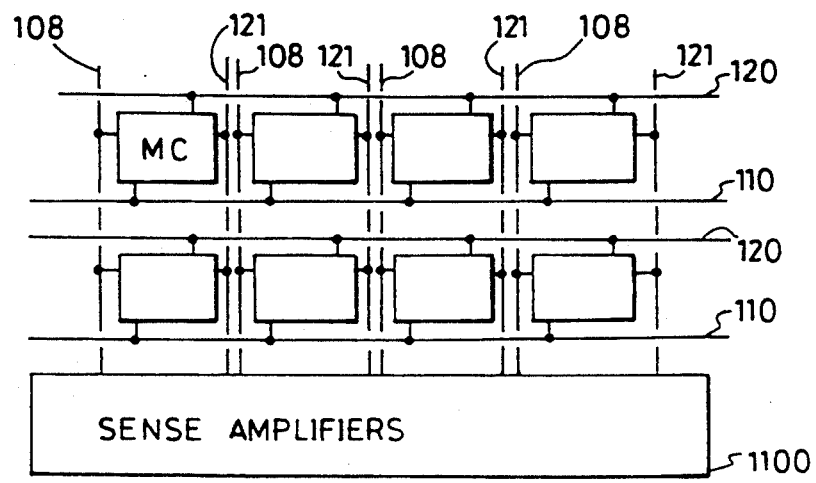
FIG. 2 is a schematic block diagram of conventional DRAM memory cell array.
Figure 3:
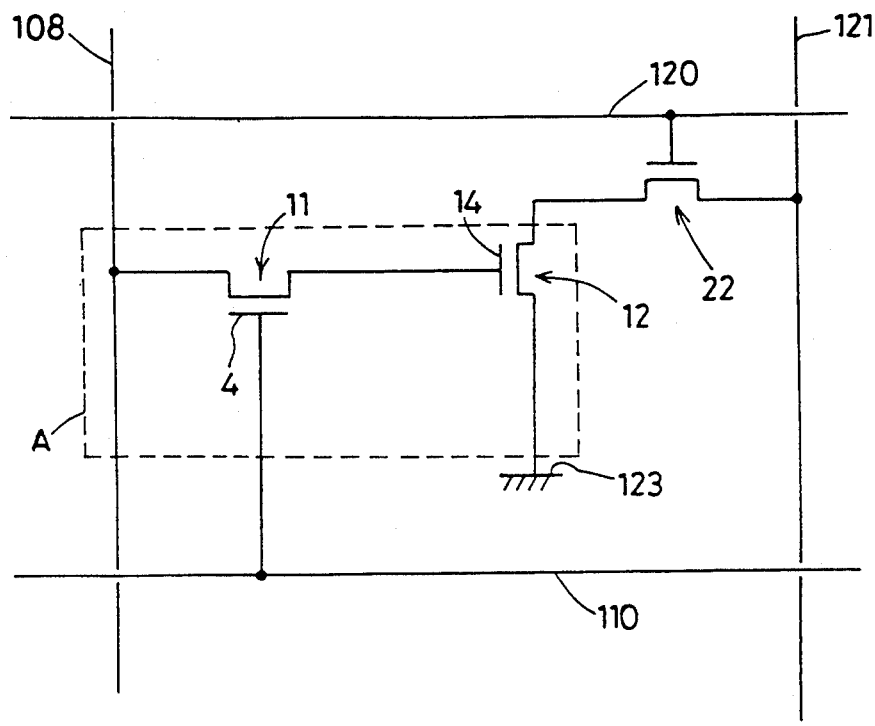
FIG. 3 is an equivalent circuit diagram of a three-transistor DRAM cell.
Figure 10:
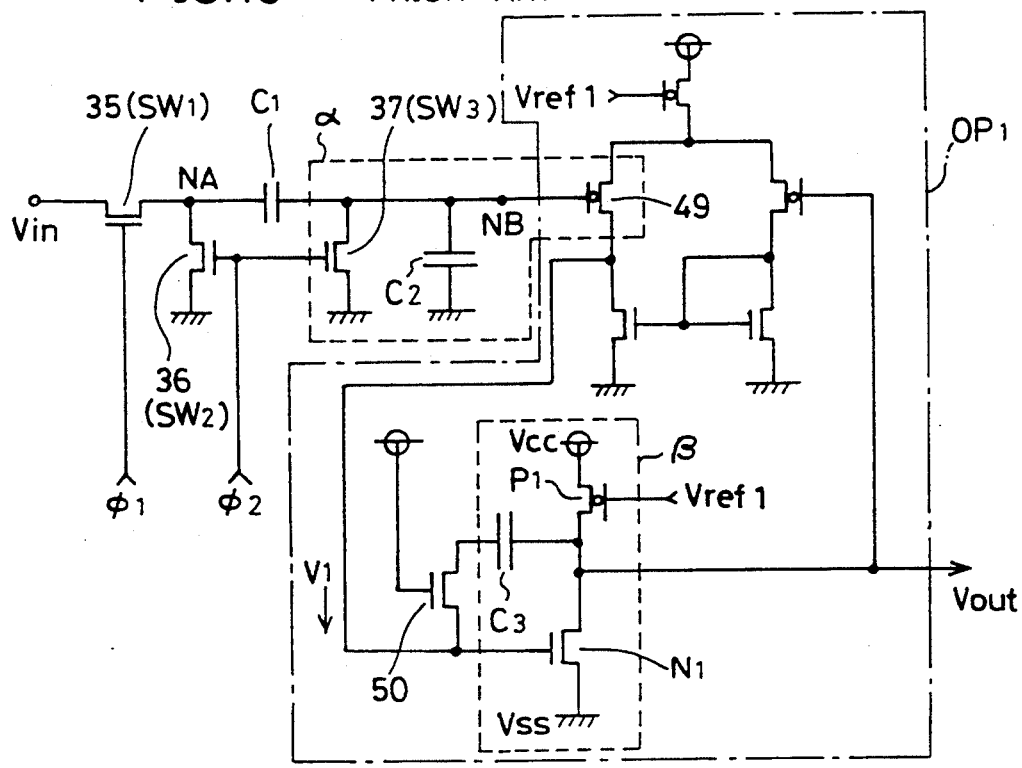
FIG. 10 is a more detailed circuit diagram of the analog multiplier shown in FIG. 9.
Figure 11:
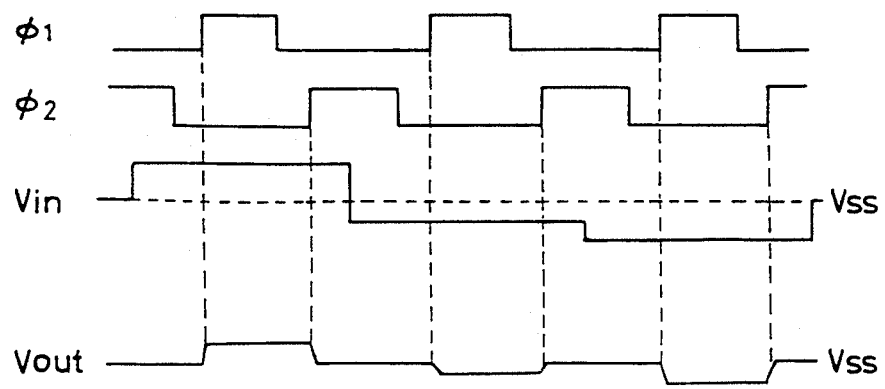
FIG. 11 is a timing chart showing an operation of the analog multiplier shown in FIGS. 10 and 11.

Referring to FIG. 10, a circuit portion $\alpha$ shown by the dashed line has the configuration similar to that of the circuit A shown in FIG. 3 as is previously described. Therefore, the circuit portion $\alpha$ can be implemented with the structure shown in the cross sectional view of FIG. 12. It is possible to substantially reduce the area occupied by the circuit portion $\alpha$ by employing the stacked capacitor of the present invention, which doubles as the interconnection.

The technique of the semiconductor integrated circuit device according to the present invention is also applicable to a circuit portion $\beta$ of the operational amplifier OP1. The circuit portion $\beta$ includes an N channel transistor N1, a P channel transistor P1 and the capacitor C3. One electrode of the capacitor C3 is connected to that of another N channel transistor 50 included in the operational amplifier OP1.

A gate electrode of the N channel transistor N1 is connected to one terminal of the P channel transistor 49 and to that of the N channel transistor 50. The N channel transistor N1 has its drain connected to ground potential Vss and its source connected to a drain of the P channel transistor P1.

The P channel transistor P1 has its source connected to a supply potential Vcc and its gate supplied with the reference voltage Vref1. The other electrode of the capacitor C3 is connected to the drain of the P channel transistor P1 and to the source of the N channel transistor N1. An output voltage Vout can be obtained from a point where the P channel transistor P1 and the N channel transistor N1 are connected to each other.

Referring to FIGS. 28-31, the semiconductor integrated circuit device includes a P type semiconductor substrate 7 having a main surface divided into two regions by an N type well 38 formed on the substrate 7.

At the boundary of the N type well 38 and the other region, an N+ impurity region 46 of high concentration is formed as a guard ring. An isolation region 6b is provided adjacently to the N+ impurity region 46 on the N type well 38. In the surface of the N type well 38, an isolation region 6a defining an active region 39 between the isolation regions 6a and 6b is formed with a predetermined space apart from the isolation region 6b.

On the isolation region 6a is provided a polysilicon interconnection layer 43 to which a supply voltage Vcc is applied and a portion of which projects over the active region 39.

Two P channel transistors P1, P1' are formed on the active region 39. The portion 43' of the polysilicon interconnection layer 43, projecting over the active region 39, further extends over the N+ impurity region 46 and is connected to the N+ impurity region 46 through a contact hole. On the isolation region 6b is provided a polysilicon interconnection layer 41 to which the reference voltage Vref1 is externally applied and which forms two projecting portions 45 and 45' along the opposite sides of the polysilicon interconnection layer 43'.

The P channel transistor P1 includes a P+ impurity region 39a formed on the active region 39, a P+ impurity region 39b spaced apart from the impurity region 39a, and a polysilicon interconnection layer 45 formed between the impurity regions 39a and 39b on the semiconductor substrate 7 with a gate oxide film sandwiched therebetween. The polysilicon interconnection layer 45 is a gate electrode of the P channel transistor P1.

The P channel transistor P1' includes a P+ impurity region 39b, and a polysilicon interconnection layer 45' formed between the impurity regions 39b and 39c on the substrate 7 with the gate oxide film sandwiched therebetween. The polysilicon interconnection layer 45' is a gate electrode of the transistor P1'.

On the other region in the main surface of the substrate 7 in which the N type well 38 is not formed, are formed an isolation region 6c provided along the spaced apart from the isolation region 6c and defining an active region 40, N channel transistors N1 and N1' formed on the active region 40, a polysilicon interconnection layer 44 provided above the isolation region 6d and connected to the ground potential Vss, and a polysilicon interconnection layer 42 which is provided on the isolation region 6c and to which an output voltage V1 from the P channel transistor 49 in FIG. 10 is inputted.

A portion of the polysilicon interconnection layer 44, projecting over the active region 40, forms a polysilicon interconnection layer 44'. The polysilicon interconnection layer 42, projecting over the active region 40 along the opposite sides of the polysilicon interconnection layers 51, 51'.

The N channel transistor N1 includes an N+ impurity region 40a formed on the active region 40, an N+ impurity region 40b spaced apart from the impurity region 40a, and a polysilicon interconnection layer 51 formed between the impurity regions 40a and 40b on the substrate 7 with the gate oxide film therebetween. The polysilicon interconnection layer 51 is a gate electrode of the transistor N1.

The N channel transistor N1' includes an N+ impurity region 40c formed on the active region 40, the impurity region 40b, and a polysilicon interconnection layer 51' formed between the impurity regions 40b and 40c on the substrate 7 with the gate oxide film therebetween. The polysilicon interconnection layer 51' is a gate electrode of the transistor N1'. The polysilicon interconnection layer 44' is connected to the impurity region 40b through a contact hole. The polysilicon interconnection layer 43' is also connected to the impurity region 39b through the contact hole.

According to this preferred embodiment, the guard ring is provided only in the N type well 38. However, another guard ring may be provided in regions other than the N type well 38.

This semiconductor integrated circuit device is characterized in that the capacitor C3 is employed as an interconnection for the P impurity regions 39a and 39c and the N+ impurity regions 40a and 40c. The capacitor C3 includes a storage node 1 made of polysilicon, covering the transistors P1, P1', N1 and N1' and connected to the P+ impurity regions 39a and 39c and to the N+ impurity regions 40a and 40c through a contact hole, a dielectric film 3 formed on the storage node 1, and a cell plate 2 formed on the dielectric film 3 to cover the storage node 1. The storage node 1 serves as an interconnection for drains of the P channel transistors P1 and P1' and sources of the N channel transistors N1 and N1'.

It is preferable in general that the transistors P1, P1, N1 and N1' all have large channel widths in order to decrease an output impedance. Further, the capacitor C3 with larger capacitance is required as described above. Therefore, a considerably large area is required for implementing the circuit portion β. However, as shown in the preferred embodiments of the present invention, the transistor and the stacked capacitor can be designed overlapping each other by employing the storage node 1 as the interconnection.

As shown in FIGS. 18-21, the storage node 1 can be designed to acquire an extremely large area, covering all of the P channel transistors P1, P1' and the N channel transistors N1 and N1'. Therefore, it is possible to secure a sufficiently large channel width for each of the transistors and also secure a sufficient charge storing capacitance for the capacitor. As is apparent from this preferred embodiment, according to the present invention, it is possible to implement the semiconductor integrated circuit device which has high potential for integration and still capable of offering highly reliable operation.

The foregoing description of preferred embodiments of the invention has been presented for purposes of illustrating and describing the main points of the concepts of the invention. However, the present invention is not limited to those embodiments. This invention positively utilizes the conductive layer of the interconnection as the capacitor and thus is applicable to various kinds of circuits requiring the capacitors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A memory cell comprising:
   first, second, third and fourth signal lines;
   two pairs of MOS transistors, each pair capable of acting independent of the other;
   first and second capacitors; and
   another MOS transistor; wherein
   a first pair of said MOS transistors includes
   a first MOS transistor being controlled by said first signal line and having two electrodes, one of said electrodes being connected to said second signal line, and
   a second MOS transistor having the gate thereof connected to the other electrode of said first MOS transistor, and having two electrodes, one of said electrodes being connected to said second signal line;

said first capacitor includes a first electrode layer and a second electrode layer with a dielectric film therebetween, said first electrode layer interconnecting an impurity region of said first MOS transistor and the gate of said second MOS transistor and said first and second electrode layers being formed of different layers than the gate of said second MOS transistor;

a second pair of said MOS transistors includes a third MOS transistor being controlled by said first signal line and having two electrodes, one of said electrodes being connected to said third signal line, and a fourth MOS transistor having the gate connected to the other electrode of said third MOS transistor and having two electrodes, one of said electrodes being connected to the third signal line;

said second capacitor includes a first electrode layer and a second electrode layer with a dielectric film therebetween, said first electrode layer interconnecting an impurity region of said third MOS transistor and the gate of said fourth MOS transistor, and said first and second electrode layers being formed of different layers than the gate of said fourth MOS transistor; and said another transistor connects said third and fourth MOS transistors to said fourth signal line and has the gate connected to said fourth signal line.

2. The memory cell according to claim 1, wherein said first capacitor comprises a storage node connecting the drain of said first MOS transistor and the gate of said second MOS transistor, a dielectric film formed on said storage node, and a cell plate formed on said dielectric film.

3. The memory cell according to claim 1, wherein said second capacitor comprises a storage node connecting the drain of said third MOS transistor and the gate of said second MOS transistor, a dielectric film formed on said storage node; and a cell plate formed on said dielectric film.

4. A semiconductor integrated circuit device comprising:

a semiconductor substrate having a main surface;

a first field effect device comprising first and second impurity regions separated by a first channel region formed at said main surface, and a first gate electrode formed over said first channel region and a portion of said first and second impurity regions;

a second field effect drive comprising third and fourth impurity regions separated by a second channel region formed at said main surface, and a second gate electrode formed over said second channel region and a portion of said third and fourth impurity regions;

an insulator layer formed on said first and second field effect devices; and a capacitor connecting said first and second field effect devices, said capacitor having first and second electrode layers with a dielectric film therebetween, said first and second electrode layers having approximately the same thickness and being formed of different layers than said first and second gate electrodes; wherein said first electrode layer is formed on said insulator layer and interconnects an impurity region of said first field effect device and said second gate electrode of said second field effect device.

5. A semiconductor integrated circuit device comprising:

a semiconductor substrate having a main surface;

a first field effect device comprising first and second impurity regions separated by a first channel region formed at said main surface, and a first gate electrode layer formed over said first channel region and a portion of said first and second impurity regions;

a second field effect drive comprising third and fourth impurity regions separated by a second channel region formed at said main surface, and a second gate electrode layer formed over said second channel region and a portion of said third and fourth impurity regions;

an insulator layer formed on said first and second field effect devices; and a capacitor connecting said first and second field effect devices, said capacitor having first and second electrode layers with a dielectric film formed therebetween, wherein said first electrode layer is formed on said insulator layer and interconnects an impurity region of said first field effect device and said second gate electrode layer, and said first and second electrode layers are formed of different layers than said first and second gate electrode layers.

6. A semiconductor integrated circuit device comprising:

a semiconductor substrate having a main surface;

a first field effect device including first and second impurity regions separated by a first channel region formed at said main surface, and a first gate electrode formed over said first channel region and a portion of said first and second impurity regions;

a second field effect drive including third and fourth impurity regions separated by a second channel region formed at said main surface, and a second gate electrode formed over said second channel region and a portion of said third and fourth impurity regions;

an insulator layer formed on said first and second field effect devices;

a first capacitor connecting said first and second field effect devices, said first capacitor having first and second electrode layers with a dielectric film therebetween, said first electrode layer being formed on said insulator layer and connecting an impurity region of said first field effect device and said second gate electrode of said second field effect device;

a third field effect device including fifth and sixth impurity regions separated by a third channel region formed at said main surface, and a third gate electrode formed over said third channel region and a portion of said fifth and sixth impurity regions;

a fourth field effect device including seventh and eight impurity regions separated by a fourth channel region formed at said main surface, and a fourth gate electrode formed over said fourth channel region and a portion of said seventh and eight impurity regions; and a second capacitor connecting said third and fourth field effect devices, said second capacitor having first and second electrode layers with a dielectric film therebetween; wherein said insulator layer is formed on said third and fourth field effect devices;

said first electrode layer of said second capacitor is formed on said insulator layer and is connected to an impurity region of said third field effect device and said fourth gate electrode of said fourth field effect device, and said first and second electrode layers of said first and second capacitors are formed of different layers than said first, second, third and fourth gate electrode layers.

7. The semiconductor integrated circuit device in according with claim 6, further comprising
transistor means for interconnecting said fourth impurity region of said second field effect device and said eighth impurity region of said fourth field effect device.

8. A memory cell comprising:
a semiconductor substrate having a main surface;
first, second, third and fourth signal lines for carrying control signals;
a first MOS transistor controlled by a signal on said first signal line and having first source and drain impurity regions formed in the main surface of said substrate, a first channel region formed therebetween, and a first gate electrode formed over said first channel region, one of said first source and drain impurity regions being connected to said second signal line;
a second MOS transistor having second source and drain impurity regions in the main surface of said substrate, a second channel region being formed therebetween, and a second gate electrode formed over said second channel region, the second gate electrode being connected to the other one of said first source and impurity regions, one of said second source and drain regions being connected to said second signal line;
a first storage node interconnecting the first drain impurity region and the second gate electrode;
a dielectric film being formed on said storage node;
a first cell plate being formed on said dielectric film;
a third MOS transistor having third source and drain impurity regions formed in the main surface of said substrate, a third channel region formed therebetween and a third gate electrode formed over said third channel region, said third MOS transistor being controlled by said signal on said first signal line and one of said third source and drain impurity regions being connected to said third signal line;
a fourth MOS transistor having fourth source and drain impurity regions formed in the main surface of said substrate, a fourth channel region formed therebetween and a fourth gate electrode formed over said fourth channel region, said fourth gate electrode being connected to the other one of said third source and drain impurity regions and one of said fourth source and drain impurity regions being connected to the third signal line;
a second storage node interconnecting the third drain impurity region and the fourth gate electrode;
said dielectric film formed on said second storage mode;
a second cell plate formed on said dielectric film; and
transistor means being controlled by a signal on said fourth signal line for interconnecting the other one of said second source and drain regions and the other one of said fourth source and drain regions to said fourth signal line, wherein
said first and second storage nodes, and said first and second cell plates are formed of different layers than said first, second, third and fourth gate electrodes.

9. A semiconductor integrated circuit device comprising:
a first MOS type transistor having two main electrode regions formed on a main surface of a semiconductor substrate and a gate electrode formed on said main surface of said semiconductor substrate positioned between said two main electrode regions through a gate insulator,
a second MOS type transistor having two main electrode regions formed on said main surface of said semiconductor substrate and a gate electrode formed on said main surface of said semiconductor substrate positioned between said two main electrode regions of said second transistor through a gate insulator, and
a capacitor having a first electrode formed over said main surface of said semiconductor substrate, an insulating layer formed on said first electrode, and a second electrode formed on said insulating layer, said first electrode connected between one of said two electrode regions of said first transistor and the gate electrode of said second transistor, and formed extending over one of the two main electrode regions of said first transistor and the gate electrode of said second transistor, wherein
said first and second electrodes are formed of different layers than the gate electrodes of said first and second MOS type transistors.

10. A memory cell comprising:
a first MOS type transistor having a first main electrode connected to one bit line of a bit line pair, a second main electrode, and a gate electrode connected to a word line,
a second MOS type transistor having a first main electrode connected to said one bit line of said bit line pair, a second main electrode connected to a match line, and a gate electrode connected to said second main electrode of said first transistor,
a first capacitor having a first electrode connected to said second main electrode of said first transistor and said gate electrode of said second transistor and a second electrode, said first electrode of said first capacitor formed extending over said second main electrode of said first transistor and said gate electrode of said second transistor,
a third MOS type transistor having a first main electrode connected to another bit line of said bit line pair, a second electrode, and a gate electrode connected to said word line,
a fourth MOS type transistor having a first main electrode connected to said other bit line of said bit line pair, a second main electrode connected to said match line, and a gate electrode connected to second main electrode of said third transistor, and
a second capacitor having a first electrode connected to said second main electrode of said third transistor and said gate electrode of said fourth transistor, and a second electrode, said first electrode of said second capacitor formed extending over said second main electrode of said third transistor and said gate electrode of said fourth transistor, wherein said first and second electrodes of said first and second capacitors are formed of different layers than the gate electrodes of said first, second, third and fourth MOS type transistors.

11. A method of manufacturing a semiconductor integrated circuit device comprising:

first and second MOS transistor devices on a main surface of a semiconductor substrate, the first MOS transistor device includes first and second conductive regions, a first channel region interposed therebetween, a first dielectric film on said first channel region, and a first gate electrode formed on the first dielectric film, and the second MOS transistor device includes third and fourth conductive regions, a second channel region interposed therebetween, a second dielectric film on said second channel region, and a second gate electrode formed on the second dielectric film, the method comprising the steps of:

simultaneously forming the first, second, third and fourth conductive regions in the main surface of the semiconductor substrate;

simultaneously forming the first and second dielectric films on the first, second, third and fourth conductive regions;

simultaneously forming the first and second gate electrodes on the first and second dielectric film;

forming the first insulator layer on the first and second gate electrodes;

forming first and second contact openings in the first insulator layer, the first contact opening being formed on the first conductive region and the second contact opening being formed on the second gate electrode;

forming a first electrode layer on the first insulator, said first electrode layer covering the first and second MOS transistor devices and being electrically connected to the first conductive region by the first contact opening and to the second gate electrode by the second contact opening;

forming a third dielectric film on the first electrode layer, the third dielectric film being of a different layer than said first and second dielectric films, forming a second electrode layer on the third dielectric film, wherein the first electrode layer, the second electrode layer and the third dielectric film interposed between the first and second electrode layers constitute a capacitor.

* * * * *